US012677394B2

(12) United States Patent
Ting et al.

(10) Patent No.: US 12,677,394 B2
(45) Date of Patent: Jul. 7, 2026

(54) ISOLATION DEVICE FOR ISOLATING LEAKED LIQUID COOLANT AND ELECTRONIC EQUIPMENT INCLUDING ISOLATION DEVICE

(71) Applicant: Fulian Precision Electronics (Tianjin) Co., LTD., Tianjin (CN)

(72) Inventors: Yu-Chia Ting, Neihu (TW); Tsung-Lin Liu, Neihu (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 864 days.

(21) Appl. No.: 17/890,462

(22) Filed: Aug. 18, 2022

(65) Prior Publication Data

US 2023/0337395 A1 Oct. 19, 2023

(30) Foreign Application Priority Data

Apr. 15, 2022 (CN) .......................... 202210399981.6

(51) Int. Cl.
*H05K 7/20* (2006.01)
*F01P 11/02* (2006.01)

(52) U.S. Cl.
CPC .......... *H05K 7/20272* (2013.01); *F01P 11/02* (2013.01); *F01P 2031/18* (2013.01)

(58) Field of Classification Search
CPC ....................... H05K 7/20254; H05K 7/20272
See application file for complete search history.

(56) References Cited

U.S. PATENT DOCUMENTS

| | | | | |
|---|---|---|---|---|
| 10,098,258 B2 * | 10/2018 | Chainer | ............. | H05K 7/20781 |
| 11,175,102 B1 * | 11/2021 | Harrington | ............. | F28F 9/165 |
| 11,310,938 B2 * | 4/2022 | Su | ........................... | G01M 3/183 |
| 11,490,546 B2 * | 11/2022 | Edmunds | ........... | H05K 7/20772 |
| 11,729,946 B2 * | 8/2023 | Gao | .................... | H05K 7/20272 |
| | | | | 361/679.53 |
| 11,980,006 B2 * | 5/2024 | Gao | .................... | H05K 7/20254 |
| 12,089,367 B2 * | 9/2024 | Wu | ..................... | H05K 7/20772 |
| 2015/0351283 A1 * | 12/2015 | Yamada | ................ | H01L 23/473 |
| | | | | 165/80.4 |

(Continued)

FOREIGN PATENT DOCUMENTS

| | | | | | |
|---|---|---|---|---|---|
| CN | 111132516 A | * | 5/2020 | ......... | H05K 7/20327 |
| CN | 112911905 A | * | 6/2021 | ......... | H05K 7/20709 |

(Continued)

*Primary Examiner* — Devon Lane
(74) *Attorney, Agent, or Firm* — ScienBiziP, P.C.

(57) ABSTRACT

An isolation device for isolating leaked liquid coolant and an electronic equipment carrying same are disclosed. The isolation device includes a liquid cooling radiator, a fixing structure, and a detection device. The liquid cooling radiator includes a first housing and a second housing which are connected with each other and enclose a chamber allowing a liquid coolant to flow therethrough. The first housing defines a groove away from the chamber, a bottom wall of the groove including a first end and a second end lower than the first end. The fixing structure is disposed on the bottom wall and configured to fix a pipe. The groove is configured to receive liquid coolant leaked from a connection between the fixing structure and the pipe. The detection device is disposed on the second end and configured to detect presence of liquid.

16 Claims, 6 Drawing Sheets

1000

(56) References Cited

U.S. PATENT DOCUMENTS

| 2020/0340767 A1* | 10/2020 | Holden | H05K 7/20254 |
| 2020/0352053 A1* | 11/2020 | Mizerak | H05K 7/20772 |
| 2023/0061298 A1* | 3/2023 | Gao | G01M 3/38 |
| 2023/0066006 A1* | 3/2023 | Gao | H05K 7/20781 |

FOREIGN PATENT DOCUMENTS

| CN | 216288411 U | 4/2022 |
| JP | 2007170897 A | 7/2007 |

* cited by examiner

ISOLATION DEVICE FOR ISOLATING LEAKED LIQUID COOLANT AND ELECTRONIC EQUIPMENT INCLUDING ISOLATION DEVICE

FIELD

The subject matter herein generally relates to cooling systems, and more particularly to an isolation device for isolating leaked liquid coolant and an electronic equipment including the isolation device.

BACKGROUND

High-power computing applications such as cloud computing, edge computing, demands increased power density of a server, and increased heat-generating value of the server correspondingly. When a high-power server is liquid-cooled, leakage of coolant is one of the biggest risks in such a server. The leaked coolant may damage the server or render the server and other electronic equipment useless.

BRIEF DESCRIPTION OF THE DRAWINGS

Implementations of the present disclosure will now be described, by way of embodiments, with reference to the attached figures.

DETAILED DESCRIPTION

Figure 1:
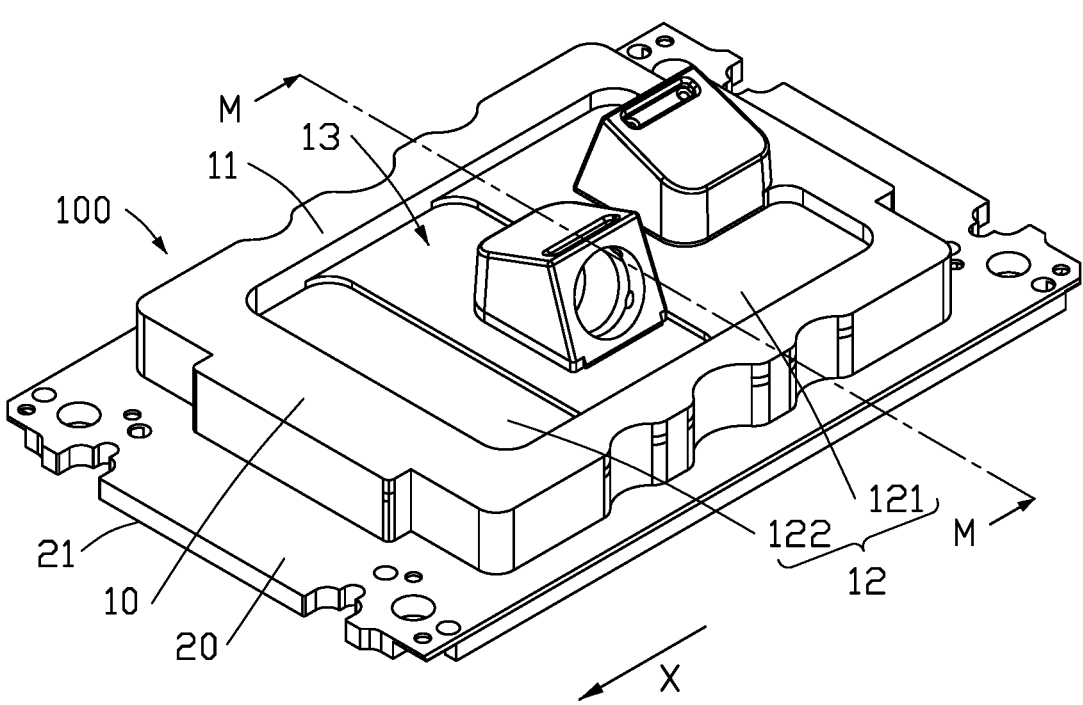
FIG. 1 is a partial schematic diagram of an isolation device according to an embodiment of the present disclosure.

The invention can be more fully understood by reading the subsequent detailed description and examples with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, when a first component is referred to as "connecting" to a second component, it is intended that the first component may be directly connected to the second component or may be indirectly connected to the second component via a third component between them. When a first component is referred to as "disposed to" a second component, it is intended that the first component may be directly disposed to the second component or may be indirectly disposed to the second component via a third component between them.

Unless otherwise defined, all terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. The term "and/or" used herein includes any suitable combination of one or more related items listed.

Figure 2:
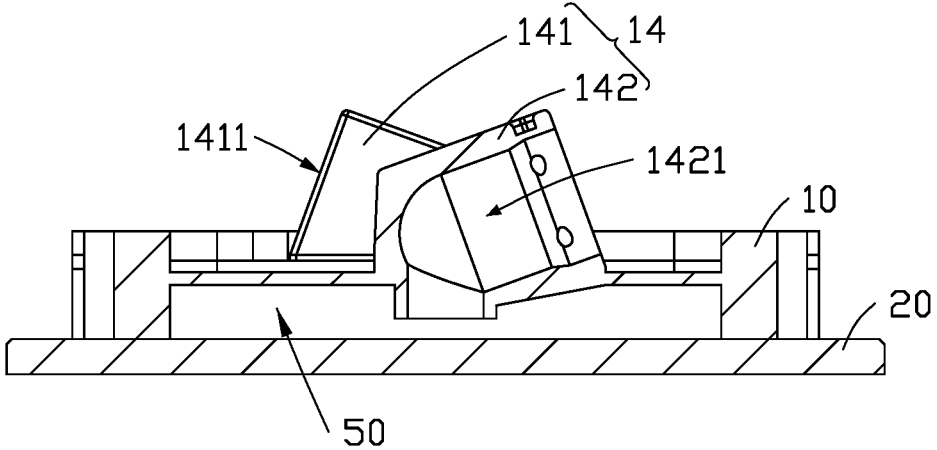
FIG. 2 is a cross-sectional view along line M-M of FIG. 1.
Figure 3:
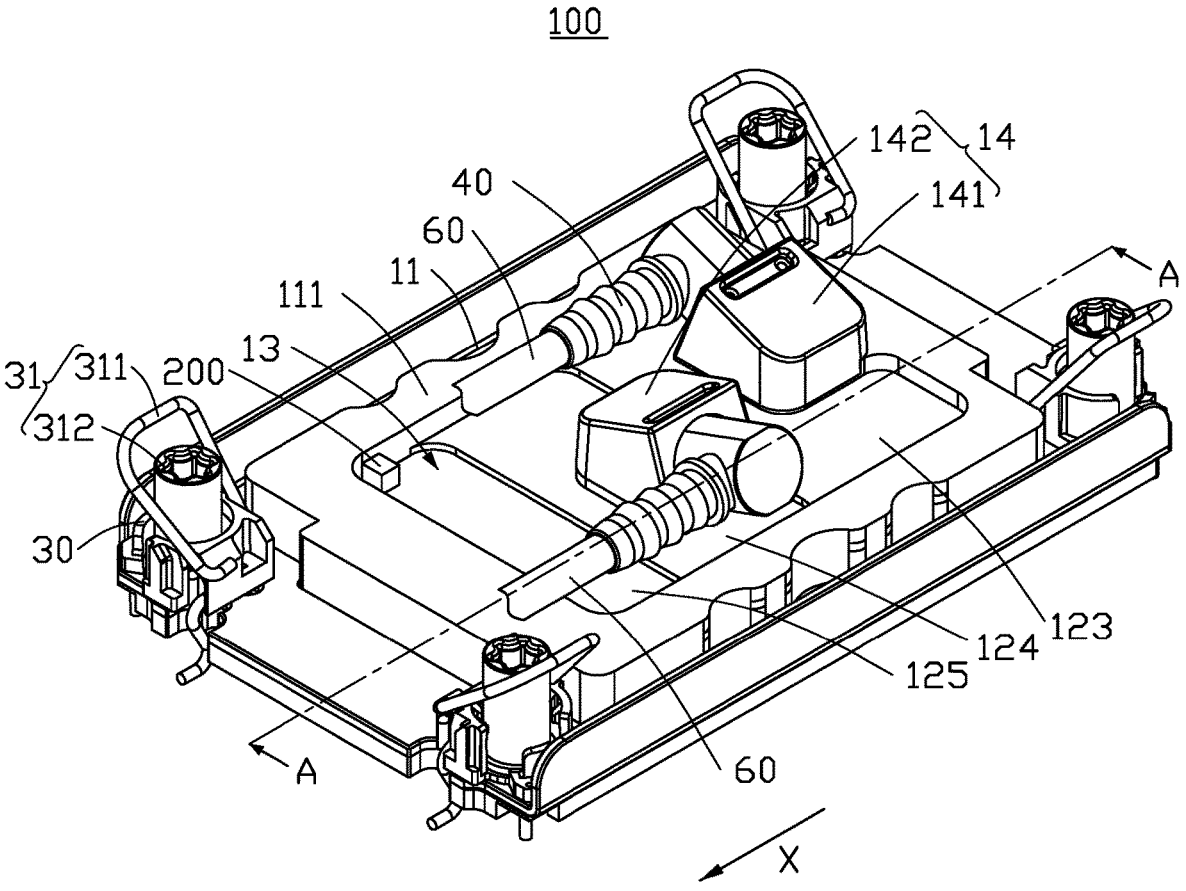
FIG. 3 is a schematic diagram of an isolation device according to another embodiment of the present disclosure.

Referring to FIGS. 1 to 3, an isolation device 1000 for isolating leaked liquid coolant is illustrated. The isolation device 1000 includes a liquid cooling radiator 100 and a detection device 200. The liquid cooling radiator 100 includes a first housing 10 and a second housing 20. The first housing 10 is connected with the second housing 20, and a chamber 50 is formed between the first housing 10 and the second housing 20. The first housing 10 and the second housing 20 cooperatively form the chamber 50. The chamber 50 of the liquid cooling radiator 100 allows a heat-carrying liquid coolant (not shown) to flow therethrough so as to cool the liquid coolant.

In one embodiment, the first housing 10 is detachably connected with the second housing 20, which facilitates the cleaning of the interiors of the first housing 10 and the second housing 20.

In one embodiment, the first housing 10 and the second housing 20 are sealed by a sealing member (not shown) therebetween, so as to reduce leakage of the liquid coolant in the chamber 50.

In another embodiment, the liquid cooling radiator 100 is integrally formed, that is, the first housing 10 and the second housing 20 are formed as an integral unit.

The first housing 10 defines a groove 13 on a surface away from the chamber 50. The groove 13 includes a side wall 11 and a bottom wall 12. The bottom wall 12 is located on a side of the side wall 11. The bottom wall 12 and the side wall 11 enclose the groove 13. The bottom wall 12 extends along a first direction X and includes a first end 121 and a second end 122 opposite to the first end 121 in the first direction X. The first end 121 is higher than the second end 122.

A fixing structure 14 is disposed on the bottom wall 12. The fixing structure 14 includes two fixing bases for fixing two pipes 60. For ease of description, the two fixing bases are named as a first fixing base 141 and a second fixing base 142. The first fixing base 141 has a first flow passage 1411, and the second fixing base 142 has a second flow passage 1421. The two pipes 60 communicate with the chamber 50 through the first flow passage 1411 and the second flow passage 1421. The two pipes 60, the chamber 50, the first flow passage 1411, and the second flow passage 1421 together form a channel to carry liquid. The liquid coolant is circulated in the channel.

The second housing 20 comprises a cooling surface 21 facing away from the first housing 10. The cooling surface 21 is disposed on a heat-generating component of an electronic equipment, so as to facilitate heat dissipation of the electronic equipment. The electronic equipment includes but is not limited to servers, computers, etc. The heat-generating component includes but is not limited to CPU (central processing unit), GPU (graphics processing unit), memory, etc.

Each of the first fixing base 141 and the second fixing base 142 is connected with a pipe joint 40. The first fixing base 141 and the second fixing base 142 communicate with the two pipes 60 through two pipe joints 40. When liquid coolant leaks from the connections between the pipe joints 40 and the pipes 60 or from the connections between the pipe joints 40 and the fixing bases, the leaked liquid coolant drops into the groove 13. Since the first end 121 of the bottom wall 12 of the groove 13 is higher than the second end 122, the leaked liquid coolant accumulates at the second end 122. The detection device 200 is installed at the second end 122. The detection device 200 detects the presence of liquid at the second end 122 and generates a signal accordingly.

Figure 4:
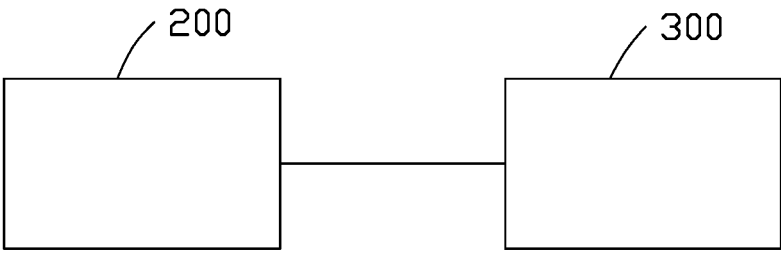
FIG. 4 is a schematic diagram of a relationship between a detection device and a control system of an isolation device according to another embodiment of the present disclosure.

Referring to FIG. 4, in one embodiment, the isolation device 1000 further includes a control system 300. The control system 300 is electrically connected with the detection device 200. When the detection device 200 detects liquid and generates a signal, the signal is sent to the control system 300, the control system 300 receives the signal and sends control commands, such as controlling the electronic equipment or a cooling device to be powered off.

In other embodiments, the control system 300 may be omitted, and when liquid is detected by the detection device 200, the detection device gives an alarm.

Figure 5:
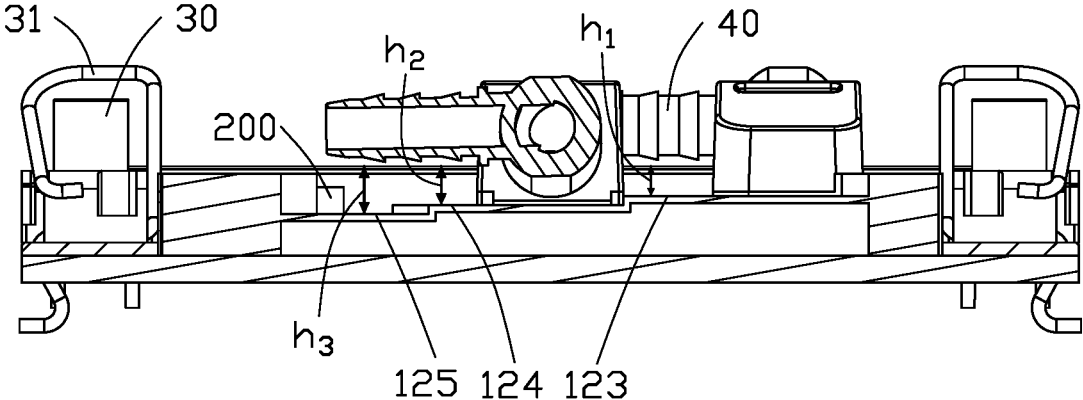
FIG. 5 is a cross-sectional view along line A-A of FIG. 3.

Referring to FIGS. 3 and 5, in one embodiment, the side wall 11 includes a top surface 111 which is located on a side of the side wall 11 away from the bottom wall 12. The bottom wall 12 includes a first bottom surface 123, a second bottom surface 124, and a third bottom surface 125. The first bottom surface 123 has a first depth $h_1$ relative to the top surface 111, the second bottom surface 124 has a second depth $h_2$ relative to the top surface 111, and the third bottom surface 125 has a third depth $h_3$ relative to the top surface 111, and $h_1 < h_2 < h_3$. That is, the bottom wall 12 is horizontally stepped, facilitating liquid to flow downward and converge at the second end 122 of the liquid cooling radiator 100.

The number of bottom surfaces of the bottom wall 12 is set according to a size of the groove 13. The number of the bottom surfaces of the bottom wall 12 may be two, four, five, etc.

In one embodiment, the bottom wall 12 is arc-shaped, a section of the bottom wall 12 perpendicular to the first direction X is U-shaped, and an opening of such section faces away from the top surface 111. That is, the middle of the bottom wall 12 protrudes towards the top surface 111, and each side of the bottom wall 12 is lower than other locations along the bottom wall 12. Therein, released liquid will converge to both sides of the second end 122 of the bottom wall 12, and the one or more detection devices 200 may be installed at both sides of the second end 122.

In other embodiments, the bottom wall 12 is arc-shaped, a section of the bottom wall 12 perpendicular to the first direction X is U-shaped, and an opening of such section faces the top surface 111. That is, the middle of the bottom wall 12 protrudes away from the top surface 111, and the middle portion of the bottom wall 12 is lower than other locations along the bottom wall 12. Therein, released liquid will converge to the middle of the bottom wall 12 of the second end 122, and one detection device 200 may be installed at the middle of the second end 122.

In one embodiment, the isolation device 1000 further includes a bracket 30 and a fixing assembly 31 disposed on the bracket 30. In one embodiment, there are four fixing assemblies 31 disposed on four corners of the bracket 30. The liquid cooling radiator 100 is disposed on the bracket 30. The liquid radiator 100 is fixed on the electronic equipment through the fixing assembly 31. The fixing assembly 31 is detachably connected with the electronic equipment.

In one embodiment, the fixing assembly 31 includes a first fixing member 311 and a second fixing member 312. The first fixing member 311 is a lock ring, and the second fixing member 312 is specifically a hexagonal screw-threaded hole. On installation, the isolation device 1000 is pre-fixed on the heat-generating component (CPU) through four lock rings on the four corners, then hexagonal screws are inserted into the hexagonal screw-threaded holes to further fix the isolation device 1000 to the heat-generating component.

In one embodiment, the bracket 30 is detachably connected with the liquid cooling radiator 100.

In other embodiments, the bracket 30 and the liquid cooling radiator 100 are formed as an integral unit.

In one embodiment, the first housing 10 is made of plastic. The particular plastic is Acrylonitrile Butadiene Styrene (ABS) plastic, which is a terpolymer of three monomers of Acrylonitrile (A), Butadiene (B), and Styrene (S). The three monomers of ABS plastic provide three individual properties, (A) gives high chemical resistance, heat resistance, and a certain surface hardness, (B) gives elasticity, and (S) provides the easy processing and molding characteristics of thermoplastics and improved electrical properties.

In one embodiment, the second housing 20 is configured for heat dissipation and is made of metal, such as aluminum or copper.

In one embodiment, the detection device 200 is a water sensor which is configured for detecting the presence of liquid in a detection area. When liquid is detected, the water sensor will give an alarm. The connections at both ends of the pipe joint 40 are the locations prone to leakage of liquid coolant. When the liquid coolant leaks from the connections at both ends of the pipe joint 40, the liquid cooling radiator 100 receives the leaked liquid coolant and isolates the leaked liquid coolant from electronic components of the electronic equipment. Leaked liquid coolant converges along the bottom wall 12 of the groove 13 at the lowest surface of the bottom wall 12. When the leaked liquid converges to the detection area of the detection device 200, the detection device 200 detects liquid and generates a signal. The water sensor has the characteristics of being miniaturized, operates digitally, and can be a smart sensor. The water sensor occupies small installation space and can detect the presence of liquid in the detection area with high sensitivity.

Figure 6:
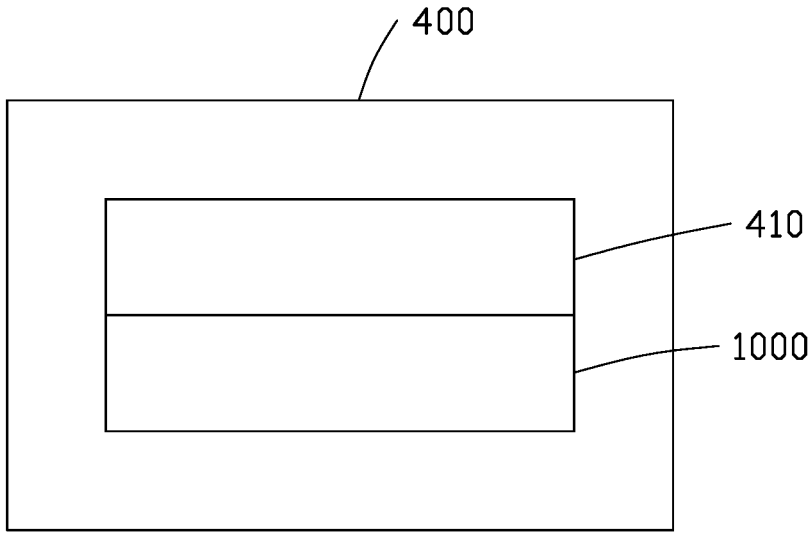
FIG. 6 is a block diagram of an electronic equipment according to an embodiment of the present disclosure.

Referring to FIGS. 3 and 6, an embodiment of an electronic equipment 400 is provided. The electronic device 400 includes the heat-generating component 410, the two pipes 60, and the isolation device 1000. The isolation device 1000 is disposed on the heat-generating component 410 and is fixed on the heat-generating component 410 via the fixing assembly 31.

The fixing structure 14 of the isolation device 1000 includes the first fixing base 141 and the second fixing base 142, each of the first fixing base 141 and the second fixing base 142 is fixedly connected with the bottom wall 12. The first fixing base 141 and the second fixing base 142 are detachably connected with the two pipe joints 40, and the two pipe joints 40 are located in or above the groove 13. An end of each of the two pipe joints 40 is connected with one pipe 60, and other ends are connected with the first fixing base 141 and the second fixing base 142. The liquid coolant flows into the chamber 50 through one pipe 60 and flows out of the chamber 50 through another pipe 60. When the liquid coolant leaks from both ends of the pipe joint 40, the liquid cooling radiator 100 contains the leaked liquid coolant. When the leaked liquid coolant flows into the detection area of the detection device 200, the leaked liquid coolant is detected by the detection device 200, and the detection device 200 generates a signal before major damage is caused to the electronic equipment.

In one embodiment, each pipe joint 40 extends from the first fixing base 141 or the second fixing base 142 towards the second end 122. When coolant leakage occurs, the liquid coolant flows out of the pipe joint 40 along the extension direction to the second end 122, which can reduce the flow path of the leaked liquid coolant on the bottom wall 12, and the leaked liquid coolant can more rapidly reach the detection area of the detection device 200, so as to accelerate the detection.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. An isolation device comprising:
a liquid cooling radiator comprising a first housing and a second housing which are connected with each other and cooperatively forming a chamber, the chamber allowing liquid coolant to flow therethrough, wherein the first housing defines a groove on a surface away from the chamber, a bottom wall of the groove comprises a first end and a second end lower than the first end, the second housing comprises a cooling surface facing away from the first housing;
a fixing structure disposed on the bottom wall and comprising a flow passage, wherein the fixing structure is configured to fix a pipe which communicates with the chamber through the flow passage; and
a detection device disposed on the second end, wherein the groove is configured to receive liquid coolant from a connection between the fixing structure and the pipe, the detection device is configured to detect presence of liquid coolant at the second end,
wherein the groove comprises a side wall protruding from the bottom wall, the side wall is a continuous side wall that surrounds the bottom wall, the side wall and the bottom wall encloses the groove; the side wall comprises a top surface away from the bottom wall, the bottom wall comprises a first bottom surface and a second bottom surface, the first bottom surface defines a first depth relative to the top surface, the second bottom surface defines a second depth relative to the top surface, and the first depth is less than the second depth.

2. The isolation device of claim 1, wherein the bottom wall is arc-shaped, and a section of the bottom wall is U-shaped.

3. The isolation device of claim 1, further comprising a bracket and a fixing assembly disposed on the bracket, wherein the liquid cooling radiator is disposed on the bracket, the fixing assembly is configured to fix the liquid cooling radiator to a heat-generating component of an electronic equipment.

4. The isolation device of claim 3, wherein the bracket and the liquid cooling radiator are an integral unit.

5. The isolation device of claim 3, wherein the fixing assembly comprises a lock ring.

6. The isolation device of claim 1, wherein the detection device is a water sensor.

7. The isolation device of claim 1, wherein the fixing structure comprises a fixing base and a pipe joint, the fixing base is fixed on the bottom wall and defines the flow passage, the pipe joint is detachably connected with the fixing base and is configured to connect the fixing base with the pipe.

8. The isolation device of claim 7, wherein the pipe joint extends from the fixing base towards the second end.

9. An electronic device comprising:
a heat-generating component;
a pipe; and
an isolation device disposed on the heat-generating component and comprising:
a liquid cooling radiator comprising a first housing and a second housing, the first housing and the second housing being connected with each other and cooperatively forming a chamber allowing a liquid coolant to flow therethrough, wherein the first housing defines a groove on a surface away from the chamber, a bottom wall of the groove comprises a first end and a second end lower than the first end, the second housing comprises a cooling surface facing away from the first housing;
a fixing structure disposed on the bottom wall and connected with the pipe, wherein the fixing structure comprising a flow passage, the pipe communicates with the chamber through the flow passage; and
a detection device disposed on the second end, wherein the groove is configured to receive liquid coolant from a connection between the fixing structure and the pipe, the detection device is configured to detect presence of liquid coolant at the second end,
wherein the groove comprises a side wall protruding from the bottom wall, the side wall is a continuous side wall that surrounds the bottom wall, the side wall and the bottom wall encloses the groove; the side wall comprises a top surface away from the bottom wall, the bottom wall comprises a first bottom surface and a second bottom surface, the first bottom surface defines a first depth relative to the top surface, the second bottom surface defines a second depth relative to the top surface, and the first depth is less than the second depth.

10. The device equipment of claim 9, wherein the bottom wall is arc-shaped, and a section of the bottom wall is U-shaped.

11. The device equipment of claim 9, further comprising a bracket and a fixing assembly disposed on the bracket, wherein the liquid cooling radiator is disposed on the bracket, the fixing assembly is configured to fix the liquid cooling radiator to the heat-generating component.

12. The device equipment of claim 11, wherein the bracket and the liquid cooling radiator are an integral unit.

13. The device equipment of claim 11, wherein the fixing assembly comprises a lock ring, the lock ring is fixed to the heat-generating component.

14. The device equipment of claim 9, wherein the detection device is a water sensor.

15. The device equipment of claim 9, wherein the fixing structure comprises a fixing base and a pipe joint, the fixing base is fixed on the bottom wall and defines the flow passage, the pipe joint is detachably connected with the fixing base and is configured to connect the fixing base with the pipe.

16. The device equipment of claim 15, wherein the pipe joint extends from the fixing base towards the second end.

\* \* \* \* \*